(12) United States Patent
Wang

(10) Patent No.: US 7,994,633 B2
(45) Date of Patent: *Aug. 9, 2011

(54) SUBSTRATE FOR ELECTRICAL DEVICE

(76) Inventor: Chung-Cheng Wang, Taichung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/852,458

(22) Filed: Aug. 7, 2010

(65) Prior Publication Data

US 2010/0294542 A1 Nov. 25, 2010

Related U.S. Application Data

(63) Continuation of application No. 11/268,702, filed on Nov. 8, 2005, now Pat. No. 7,786,567.

(51) Int. Cl.
*H01L 23/48* (2006.01)
*H01L 21/48* (2006.01)

(52) U.S. Cl. ...................... 257/693; 438/117

(58) Field of Classification Search .............. 257/686, 257/693–700; 438/109–117
See application file for complete search history.

(56) References Cited

U.S. PATENT DOCUMENTS 7,786,567 B2 * 8/2010 Wang ........................... 257/693

* cited by examiner

*Primary Examiner* — Calvin Lee

(57) ABSTRACT

Substrate for electrical devices is disclosed. An embodiment for the substrate comprised of an insulator, a conductive element(s) and a conductive material(s), wherein the conductive element embedded in the insulator, and two surfaces of the conductive element exposed to two surfaces of the insulator for electrical connection respectively, wherein the upper surface of conductive element is below the upper surface of insulator and is plated by the conductive material, meanwhile the conductive element include a protruding portion which is protruded the insulator, in this manner, solder balls are not needed, moreover the conductive element can further include an extending portion; the present invention may be capable of affording a thinner electrical device thickness and enhanced reliability.

5 Claims, 6 Drawing Sheets

SUBSTRATE FOR ELECTRICAL DEVICE

This application is a continuation of application Ser. No. 11/268,702 filed Nov. 8, 2005 now U.S. Pat. No. 7,786,567

BACKGROUND OF THE INVENTION

1. Field of the Invention

The present invention generally relates to a substrate for electrical device, and more particularly to a substrate which is enhancing the reliability of electrical device and downsizing an electrical device.

2. Description of the Related Art

Currently, both science and technology are developing rapidly, meanwhile, electrical devices are designed for thinner, wider application, lower cost, and better quality, wherein the better quality of electrical device includes higher reliability and enhanced heat dissipation, in order to achieve above objects, the manufacturers keep on developing it.

FIG. 9 shows a conventional electrical device 9 comprising a substrate 1 which including an insulator 30, a plurality of conductive elements 7,8 and a via 5, wherein said insulator 30 having a first upper surface 31 and a first lower surface 32, said first upper surface 31 of insulator 30 having an receiving area 4 which is used for accommodating a chip; said conductive element 7 is formed on said first upper surface 31 of insulator 30 and surrounding said receiving area 4, said conductive element 8 formed on said first lower surface 32 of insulator 30, said via 5 electrically connected the conductive element 7 to the conductive element 8, wherein said via 5 having a through hole 6 (i.e. the via 5 is hollow) in which an filler 43 such as solder paste, epoxy, glue or solder mask filled therein; a chip 20 mounted on the receiving area 4 of substrate 1; a conductive wire 60 electrically connected the chip 20 to the conductive element 7; an encapsulant 40 encapsulates the substrate 1, chip 20 and conductive wire 60, a solder ball 50 attached to the conductive element 8 for electrically connecting to the outside (e.g. a mother board); Accordingly, due to the solder ball 50, it is convenient for said electrical device 9 to be electrically connected to the outside, nevertheless, the cost of said electrical device 9 is increased, Moreover, the solder ball 50 is attached to the conductive element 8 by the surface 53 of the solder ball 50 exclusively, it is easy to cause peeling-off problems of said solder ball 50 by means of contamination which is happened while operating the attaching (solder ball) process, thermal effects and/or other reasons such as collision. When the peeling-off problem happened, the solder ball 50 separated from the conductive element 8 easily, it may cause the electrical device 9 not to be functional well. Furthermore, due to the via 5 is hollow, in this manner, it is easy to cause a crack problem "E" of said via 5 by means of thermal effects, when the crack "E" happened, the conductive element 7 will not be electrically connected to the conductive element 8 through said via 5 securely, then it will cause the electrical device 9 not to be functional well either; In addition, the conductive wire 60 electrically connected said chip 20 to said conductive element 7 of substrate 1 by means of a wire-bonding process, wherein said substrate 1 needs to be warm-up (i.e. heating; the temperature of heating is 140~300° C.) in order to ensure the conductive wire 60 electrically connected said chip 20 to said conductive element 7 firmly, while operating a wire-bonding process, wherein although there is a filler (e.g. solder paste) 43 filled into the through hole 6 of the via 5 for reinforcing the strength of the via 5, however said filler (solder paste) 43 will become soft during the period of heating (due to the melting temperature of solder paste is about 183° C. usually), in this manner, said conductive wire 60 does not enable to be electrically connected to said via 5 directly, but needs to be electrically connected to the conductive element 7 instead, then it is necessary for the substrate 1 to be comprised of said conductive element 7, and then cost is increased, besides, the designation of said substrate 1 is restricted too.

SUMMARY OF THE INVENTION

It is therefore an object of the invention to solve the mentioned-above problems, in accordance with the invention, the substrate includes an insulator and a plurality of conductive elements, wherein the conductive elements are embedded in the insulator, and a portion of conductive element exposed to the insulator for external connection, wherein some of the portion of conductive element exposed to the insulator enable to protrude the insulator surface for external connection, In this manner, the solder balls are not needed. Moreover, the substrate of the present invention may further comprise a submember serving as a heat spreader which is for enhancing the heat dissipation of chip, In addition, due to the conductive element of substrate is solid and hard enough, in accordance with the present invention, in this manner, the conductive wire enables to be electrically connected to the conductive element directly, then cost is saved and the restriction for designing the substrate is decreased too, moreover, the conductive element of substrate can further including an extending portion.

The aforementioned and further objects of the present invention will be more adequately appeared from the detailed description, accompanying drawings and appended claims as follow.

DETAILED DESCRIPTION OF PREFERRED EMBODIMENTS

Embodiments of the present invention will be explained with reference to the drawings as follow.

Figure 1A:
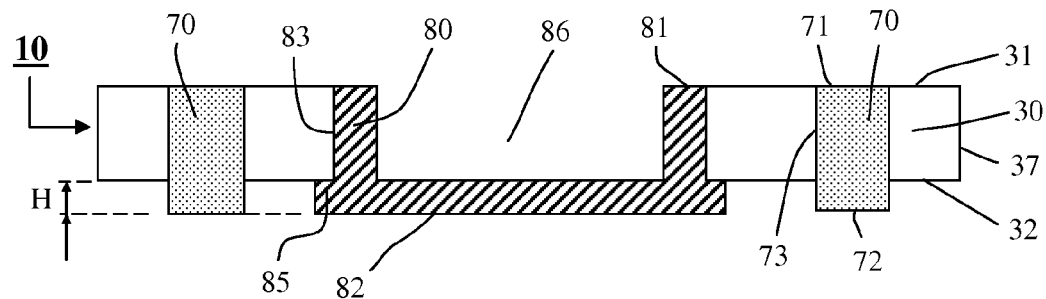
FIG. 1A shows a cross-sectional view of substrate in accordance with the present invention.
Figure 9:
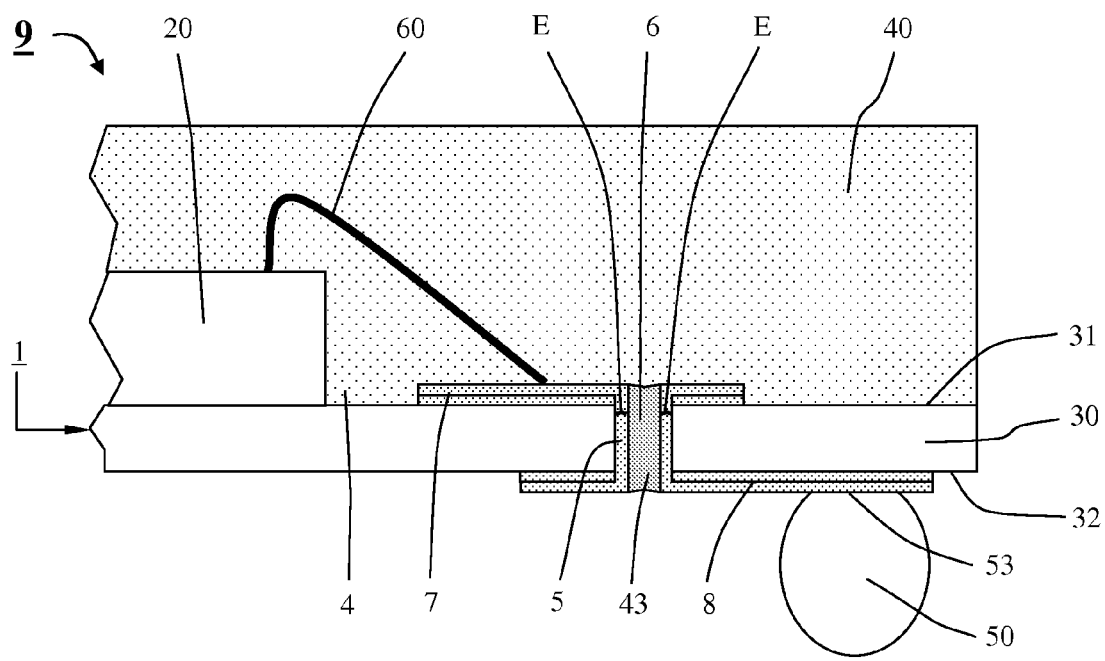
FIG. 9 shows a cross-sectional view of electrical device according to a prior art.

FIG. 1A shows a substrate 10 comprising: an insulator 30, said insulator 30 having a first upper surface 31, a first lower surface 32 and a side wall 37; a plurality of first conductive elements 70 which are made of either copper, copper alloy, nickel, aluminum, titanium or metallic alloy, said first conductive elements 70 are substantially solid; said first conductive elements 70 having a first upper surface 71, a first lower surface 72 and a first side edge 73 respectively, each said first side edge 73 of the first conductive element 70 is encapsulated by the insulator 30, in this manner, each first conductive element 70 embedded in the insulator 30, wherein the first upper surface 71 of first conductive element 70 exposed to the first upper surface 31 of insulator 30 for external connection, and the first lower surface 72 of said first conductive element 70 exposed to the first lower surface 32 of insulator 30 for external connection too, wherein the first lower surface 72 of first conductive element 70 is protruding the first lower surface 32 of insulator 30; then there is a height "H" between the first lower surface 72 of first conductive element 70 and the first lower surface 32 of insulator 30, in this manner, the first lower surface 72 of first conductive element 70 and the first lower surface 32 of insulator 30 are not in the same horizontal level; a submember 80 serving as a heat spreader which having a first upper surface 81, a first lower surface 82, a first side edge 83, an extending portion 85 and a cavity 86, wherein the cavity 86 of submember 80 is employed as the receiving area of said substrate 10 for placing chip, conductive wires, encapsulant and adhesive means such as epoxy, glue etc., wherein said extending portion 85 is for enhancing heat dissipation of chip (not shown), Furthermore, due to the first side edge 83 of submember 80 encapsulated by the insulator 30, then the submember 80 embedded in the insulator 30, and the first upper, lower surfaces 81,82 of submember 80 exposed to the first upper, lower surfaces 31, 32 of insulator 30 respectively, wherein the first lower surface 82 of submember 80 also protruding the first lower surface 32 of insulator 30, and the submember 80 may be made of the same material of the first conductive element 70 as required; in addition, the submember 80 is optional; accordingly, (i.) due to there is not any through hole in the first conductive element 70, then the problem of crack will be avoided, and the reliability of substrate 10 enhanced, and (ii.) due to the first lower surface 72 of first conductive element 70 being protruded and exposed to the first lower surface 32 of insulator 30, it is convenient for the first conductive element 70 to electrically connect to outside, then the solder ball is not needed, the cost for manufacturing the substrate 10 decreased; and (iii.) due to the first conductive element 70 is made of metallic material such as copper and is substantially solid, consequently, even though the substrate 10 is heating up to 140~300° C., the first conductive elements 70 will not become soft (because the melting temperature of the copper is about 1,083° C.), in this manner, it is hard enough for said first conductive elements 70 to be electrically connected to a conductive wire directly (refer to FIG. 2), then it is not necessary for the substrate 10 to be comprised of a conductive element (see the "7" in FIG. 9), and then cost is saved, moreover, the restriction of designing said substrate 10 is also decreased, and the reliability of said substrate 10 is enhanced.

Figure 1B:
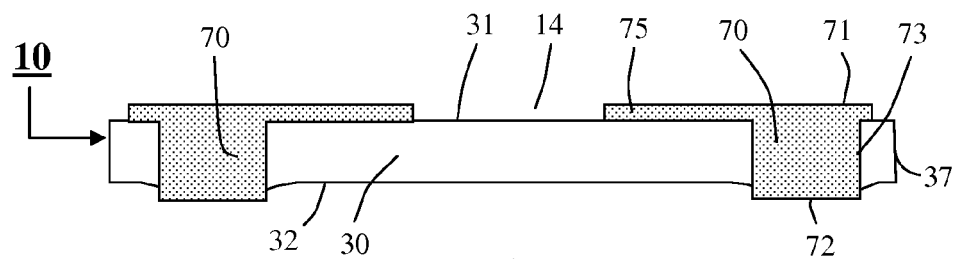
FIG. 1B shows a cross-sectional view of substrate in accordance with the present invention.

FIG. 1B shows a substrate 10 comprising: an insulator 30 having a first upper surface 31, a first lower surface 32 and a side wall 37, wherein the first lower surface 32 of insulator 30 is not substantially flat (i.e. rough); a receiving area 14 is used for accommodating a chip(s), in order that a chip enables to be mounted on said substrate 10; a plurality of first conductive elements 70, each conductive element 70 having a first upper surface 71, a first lower surface 72, a first side edge 73 and an extending portion 75, wherein the extending portion 75 is coupled with the first upper surface 31 of insulator 30, and said extending portion 75 is common unitary with said first conductive element 70 (i.e. both said extending portion 75 and said first conductive element 70 are substantially unitary), meanwhile, the first side edge 73 of first conductive element 70 encapsulated by the insulator 30 and embedded therein, wherein, the first upper, lower surfaces 71,72 of first conductive element 70 protrude and expose the first upper, lower surfaces 31, 32 of insulator 30 for external connection respectively; Accordingly, due to the first conductive element 70 having an extending portion 75, then (i.) the surface of said first conductive element 70 contacted with the insulator 30 is increased (due to not only the first side edge 73 is encapsulated by the insulator 30 but the extending portion 75 is also coupled with said insulator 30), in this manner, said first conductive element 70 enables to be coupled with said insulator 30 more securely, and then the reliability of said substrate 10 can be enhanced; and (ii.) said extending portion 75 enables to be extending upon the first upper surface 31 of said insulator 30, then the restriction of designing said substrate 10 is decreased, it is good for the industry; In addition, the other more advantages of said extending portion 75 will be explained in FIG. 3.

Figure 1C:
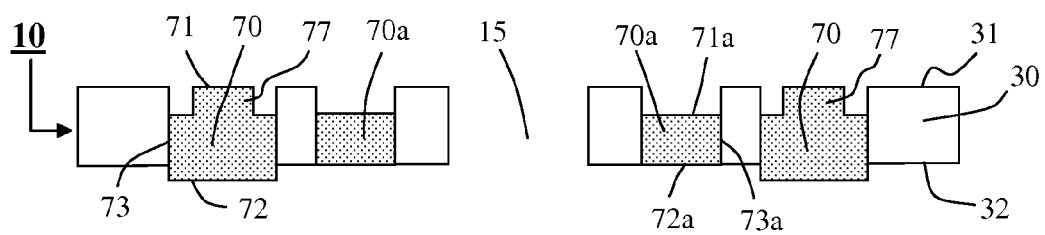
FIG. 1C shows a cross-sectional view of substrate in accordance with the present invention.
Figure 1:
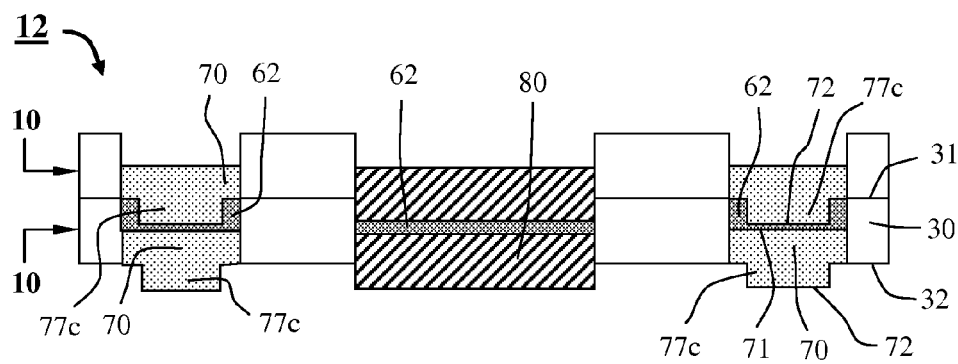
FIG. 1D shows a cross-sectional view of substrate in accordance with the present invention.
FIG. 1E shows a cross-sectional view of substrate in accordance with the present invention.
Figure 1:
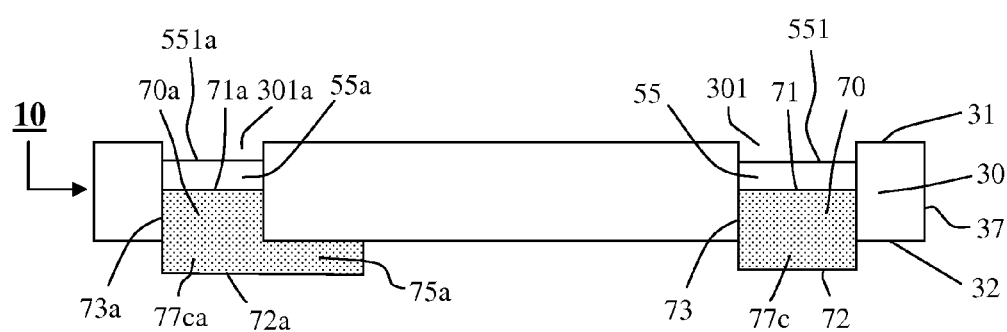
Figure 5:
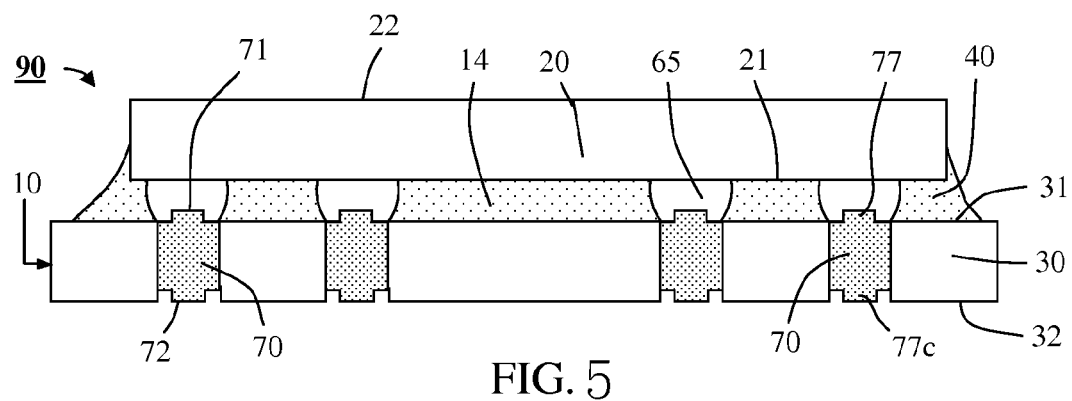

FIG. 1C shows a substrate 10 comprising: an insulator 30 having a first upper surface 31, a first lower surface 32 and a through hole 15 which is serving as a receiving area of said substrate 10 for accommodating chip(s) therein; a plurality of first conductive elements 70, each first conductive element including a protruding portion 77 having an upper surface which is employed as the first upper surface 71 of said first conductive element 70, a first lower surface 72 and a first side edge 73; a plurality of second conductive elements 70a including a first upper surface 71a of said second conductive element 70a, a first lower surface 72a and a first side edge 73a, wherein each first, second conductive element 70,70a encapsulated by the insulator 30 and embedded therein, and each first upper, lower surface 71/71a,72/72a of said first, second conductive elements 70, 70a exposed to the first upper, lower surface 31, 32 of insulator 30 respectively, wherein the first upper surface 71 of first conductive element 70 is not protruded but exposed to the first upper surface 31 of insulator 30, meanwhile the first upper surface 71a of second conductive element 70a is below and exposed to the first upper surface 31 of insulator 30, wherein because said first conductive element 70 consists of the protruding portion 77, then (i.) the surface of said substrate 10 contacted with the encapsulant (see "40" in FIG. 2) is increased, then said substrate 10 enables to be encapsulated by the encapsulant more securely, in this manner, the reliability of electrical device can be enhanced (refer to the detailed description in FIG. 2); and (ii.) the surface of said first conductive element 70 contacted with a conductive bump of chip (see "65" in FIG. 5) is increased, then said first conductive element 70 enables to be electrically connected to the conductive bump (65) firmly (refer to the detailed description in FIG. 5).

FIG. 1D shows a substrate 12 which is formed by two substrates 10 in accordance with the present invention, and each structure of substrate 10 is substantially the same as each other, said substrates 10 are stacked, wherein said substrates 10 are electrically connected to each other through the solder paste 62, and wherein each submember 80 such as a heat spreader is connected to each other through said solder paste too, in this manner, the heat dissipation of the substrate 12 enables to be enhanced, and wherein each first conductive element 70 having a protruding portion 77c (the advantages of said protruding portion 77c being described in the detailed description of FIG. 1E), and each protruding portion 77c having a lower surface which is employed as the first lower surface 72 of said first conductive element 70.

FIG. 1E shows a substrate 10 comprising: a plurality of first conductive element 70, 70a having a first upper surface 71, 71a, a first lower surface 72, 72a, a first side edge 73, 73a and a protruding portion 77c, 77ca respectively, In addition, said first conductive element 70a further comprising an extending portion 75a which is extended from the protruding portion 77ca of first conductive element 70a; an insulator 30 having a first upper surface 31, a first lower surface 32 and a side wall 37; each first conductive element 70, 70a encapsulated by said insulator 30 and embedded therein respectively, wherein each first side edge 73, 73a of said first conductive element 70, 70a being encapsulated by said insulator 30, and wherein each protruding portion 77c, 77ca of first conductive element 70, 70a being protruded and exposed to the first lower surface 32 of insulator 30, in this manner, each the first lower surface 72, 72a of first conductive element 70,70a being protruded and exposed to the first lower surface 32 of insulator 30 too; each first upper surface 71, 71a of said first conductive element 70, 70a exposed to said first upper surface 31 of said insulator 30 for being plated by (a) conductive material(s) such as nickel, palladium, silver, gold or the like for enhancing the quality of electrical connection, wherein each first upper surface 71, 71a of each first conductive element 70, 70a being below said first upper surface 31 of said insulator 30, therefore, a recess 301, 301a being formed by each first conductive element 70, 70a associated with said insulator 30 respectively, wherein the bottom of each recess 301, 301a formed by each first upper surface 71, 71a of first conductive element 70, 70a, and wherein each recess 301, 301a being for accommodating at least a conductive material; and a plurality of conductive materials 55, 55a, wherein each first upper surface 71, 71a of each conductive element 70, 70a being plated by each corresponding conductive material 55, 55a, and wherein said conductive material (55,55a) being placed within said recess (301,301a), and wherein each upper surface 551, 551a of each conductive material 55, 55a exposed to said first upper surface 31 of said insulator 30 respectively, In addition, the extending portion 75a of first conductive element 70a is common unitary with said protruding portion 77ca of first conductive element 70a and is coupled with the first lower surface 32 of insulator 30; Accordingly, (i.) due to the protruding portion (77c,77ca) of first conductive element (70, 70a) being protruded and exposed to the first lower surface 32 of insulator 30, it is convenient for the first conductive element (70,70a) to electrically connect to outside, then the solder ball is not needed, the cost for manufacturing the substrate 10 decreased; and (ii.) due to the first conductive element 70a having an extending portion 75a, then (a.) the surface of said first conductive element 70a contacted with the insulator 30 is increased (due to not only the first side edge 73a is encapsulated by the insulator 30 but the extending portion 75a is also coupled with said insulator 30), in this manner, said first conductive element 70a enables to be coupled with said insulator 30 more securely, and then the reliability of said substrate 10 can be enhanced; and (b.) said extending portion 75a enables to be attached and extended upon the first lower surface 32 of said insulator 30, then the restriction of designing said substrate 10 is decreased, it is good for the industry.

The mentioned-above insulator of substrate may be made of glass, ceramics, silicon, adhesive means such as glue, epoxy or the like, meanwhile, by means of plating process, the portion of conductive element which is exposed to the insulator and the portion of submember which is also exposed to the insulator can be plated by at least a conductive material such as nickel, palladium, silver, gold or the like for enhancing the quality of electrical connection, moreover, both the conductive element and the submember enable to be formed by predetermined shapes (patterns), furthermore, the side edge of conductive element and the side edge of submember 80 may also be exposed to the side wall 37 of insulator 30 as required.

Figure 2:
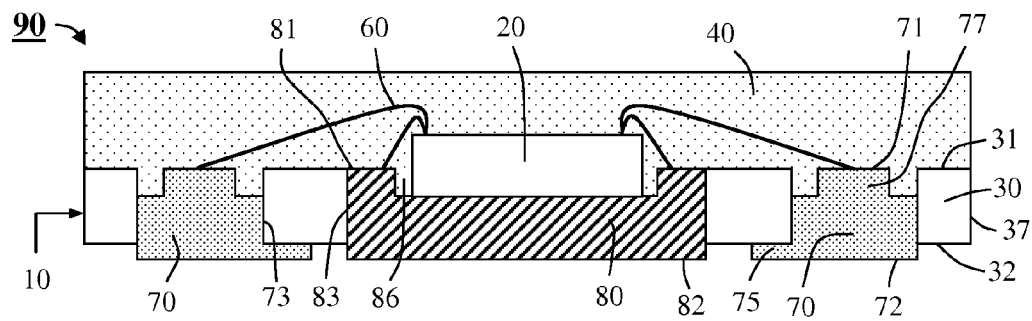
FIGS. 2~8 are cross-sectional views showing embodiments of electrical device in accordance with the present invention.

FIG. 2~8 show embodiments of electrical device, wherein the substrate of electrical device is in accordance with the present invention, detailed description as follow:

FIG. 2 shows an electrical device 90 comprising: a substrate 10 includes an insulator 30, a plurality of first conductive elements 70, and a submember 80 serving as a heat spreader, wherein said first conductive element 70 and submember 80 are embedded in the insulator 30, said first conductive element 70 having a protruding portion 77 which including an upper surface which is employed as the first upper surface of said first conductive element 70 and a first lower surface 72 which is protruding the first lower surface 32 of insulator 30 for external connection; said submember 80 having a cavity 86, wherein the cavity 86 is serving as the receiving area of substrate 10 for situating chip etc., and the first upper, lower surface 81, 82 of submember 80 exposed to the insulator 30 respectively; a chip 20 placed in the cavity 86 of submember 80; a plurality of conductive means (conductive wires) 60 electrically connected the chip 20 to the first conductive element 70 and the submember 80 respectively; an encapsulant 40 encapsulates the chip 20, conductive means 60 and the substrate 10; accordingly, due to a portion (first lower surface 72) of the first conductive element 70 protrudes and exposes the insulator 30 for electrical connection, in this manner, it is easy for the first conductive element 70 to be electrically connected to outside, then the solder ball is not needed, the cost for manufacturing the electrical device 90 is decreased, Besides, the conductive wire 60 enables to be electrically connected to the first conductive elements 70 directly, then it is not necessary for the substrate 10 to be comprised of a conductive element (see the "7" in FIG. 9), and then the restriction for designing the substrate 10 is decreased; furthermore due to the first conductive element 70 having a protruding portion 77, then the surface of said first conductive element 70 contacted with the encapsulant 40 is increased, in this manner, the substrate 10 enables to be encapsulated by the encapsulant 40 more securely in order to prevent from peeling-off problem, and then the reliability of electrical device 90 enhanced, meanwhile, due to the submember 80 of substrate 10 serving as a heat spreader, the heat dissipation of electrical device 90 enhanced too, in addition, the submember 80 of substrate 10 also serving as a conductive element, and then said submember 80 of substrate 10 enables to electrically connect to outside too, wherein another advantage of the protruding portion 77 of said first conductive element 70 will be explained in FIG. 5.

Figure 3:
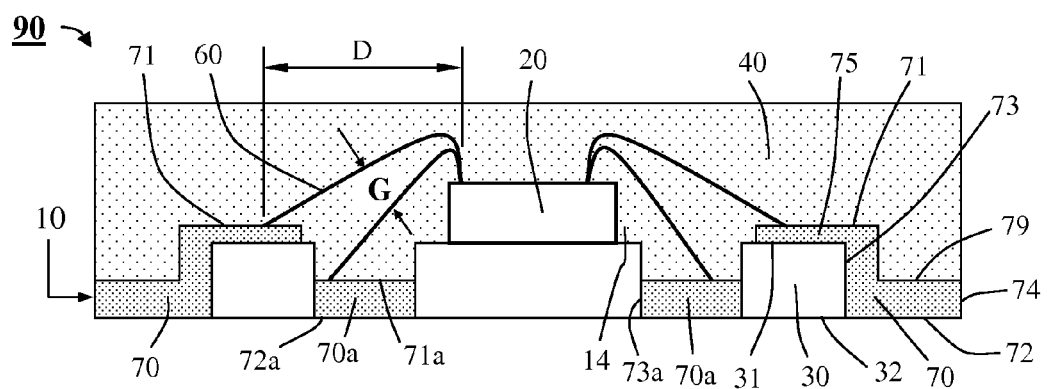

FIG. 3 shows an electrical device 90, wherein both the first conductive elements 70 and the second conductive elements 70a are embedded in the insulator 30, the first upper surface 71 of said first conductive element 70 protrudes and exposes the first upper surface 31 of insulator 30, and the extending portion 75 of said first conductive element 70 situated on the first upper surface 31 of insulator 30, nevertheless, the first upper surface 71a of the second conductive element 70a is not protruded but exposed to the first upper surface 31 of insulator 30, in this manner, the first upper surface 71 and the first upper surface 71a are not in the same horizontal level; a chip 20 mounted on the receiving area 14 of said substrate 10; accordingly, due to the first upper surface 71 of first conductive element 70 and the first upper surface 71a of the second conductive element 70a are not in the same horizontal level, in this manner, the gap "G" between the conductive mean (wire) 60 which is electrically connected to the first conductive element 70 and another conductive mean (wire) 60 which is electrically connected to the second conductive element 70a enables to become wider, in order to prevent said conductive means (wires) 60 from causing short-circuit problem; meanwhile due to the extending portion 75 of first conductive element 70, the first conductive element 70 enables to be getting closer to the receiving area 14 of substrate 10, in this manner, the distance "D" between the chip 20 and the first conductive element 70 enables to be shortened, and then the conductive wire 60 which is electrically connected the chip 20 to the first conductive element 70 enables to be shortened, therefore, the material of conductive wire 60 saved, and the cost of manufacturing the electrical device 90 saved; in addition, the second side edge 74 of the first conductive element 70 exposed to the side wall (37; not shown) of the insulator 30.

Figure 4:
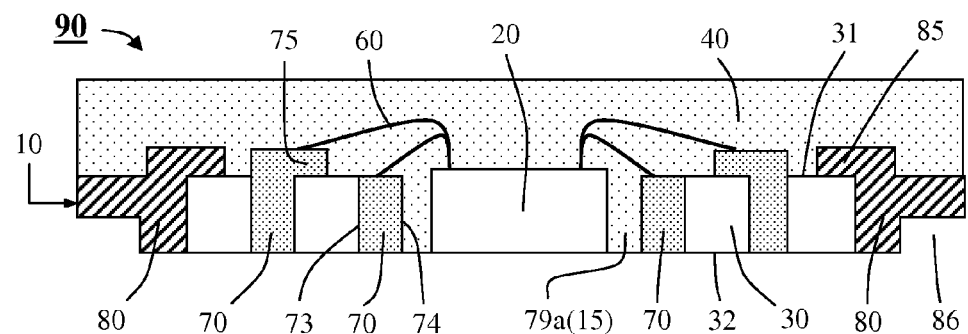

FIG. 4 shows an electrical device 90, wherein the substrate 10 including a submembers 80 such as a heat spreaders, a second conductive element 70a having a through hole 79a which is serving as the receiving area (15) of substrate 10; the chip 20 placed in the through hole 79a of said second conductive element 70a, and said second conductive element 70a surrounding said chip 20, wherein said second conductive element 70 may be serving as a power supply bus (e.g. positive supply bus and/or negative supply bus) in order to be electrically connected to a plurality of conductive wires 60; accordingly, due to the through hole 79a of said second conductive element 70a, the chip 20 enables to be placed therein, then the electrical device 90 thickness is thinner, moreover, due to the submembers 80 embedded in the insulator 30, in this manner, the heat dissipation of the chip 20 will be enhanced.

FIG. 5 shows an electrical device 90, wherein the first conductive element 70 having a plurality of protruding portions 77, 77c which are opposite to each other, wherein said protruding portion 77 of the first conductive element 70 being protruded and exposed to said first upper surface 31 of the insulator 30, however said (another) protruding portion 77c of the first conductive element 70 being not protruded but exposed to the first lower surface 32 of said insulator 30; a chip 20 situated on the receiving area 14 of substrate 10, wherein the active surface 21 of said chip 20 having a plurality of conductive means (bumps) 65, said conductive means (bumps) 65 electrically connected the chip 20 to the first conductive elements 70 of the substrate 10 respectively; an encapsulant 40 encapsulates the chip 20, conductive means 65 and the substrate 10; accordingly, due to the protruding portion 77 of said first conductive element 70, the first conductive element 70 surface contacted with the conductive bump 65 is increased, in this manner, the first conductive element 70 enables to be coupled with the conductive bump 65 more securely, in order to prevent the chip 20 from peeling off the substrate 10, and then the reliability of electrical device 90 enables to be enhanced; furthermore the inactive surface 22 of the chip 20 may also be encapsulated by the encapsulant 40 as required; in addition, the material of insulator 30 may be the same as the material of encapsulant 40 as required, and the chip 20 is employed as a flip chip.

Figure 6:
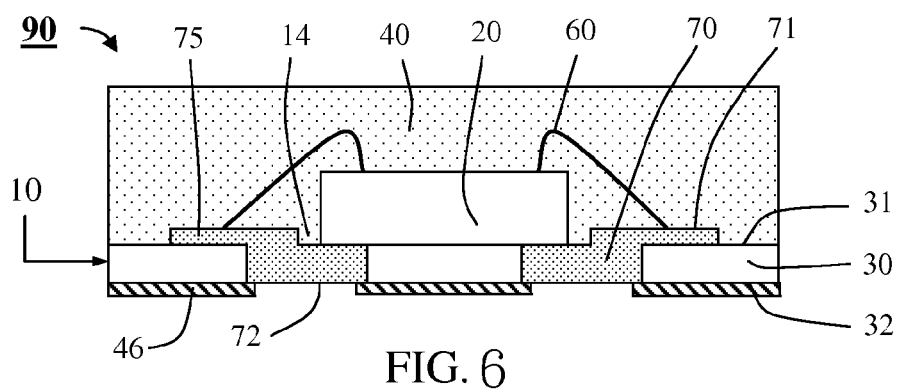

FIG. 6 shows an electrical device 90, wherein, the extending portion 75 of first conductive element 70 disposed on the first upper surface 31 of insulator 30; a chip 20 mounted on the receiving area 14, meanwhile said chip 20 also coupled with the first upper surface 71 of the first conductive element 70, wherein the receiving area 14 also including a portion of first conductive element 70; accordingly, due to a portion of first conductive element 70 involved in the receiving area 14, in this manner, the size of said electrical device 90 enables to be shrunk, and it is good for the industry; in addition, a solder mask 46 attached onto the substrate 10 for protecting said substrate 10.

Figure 7:
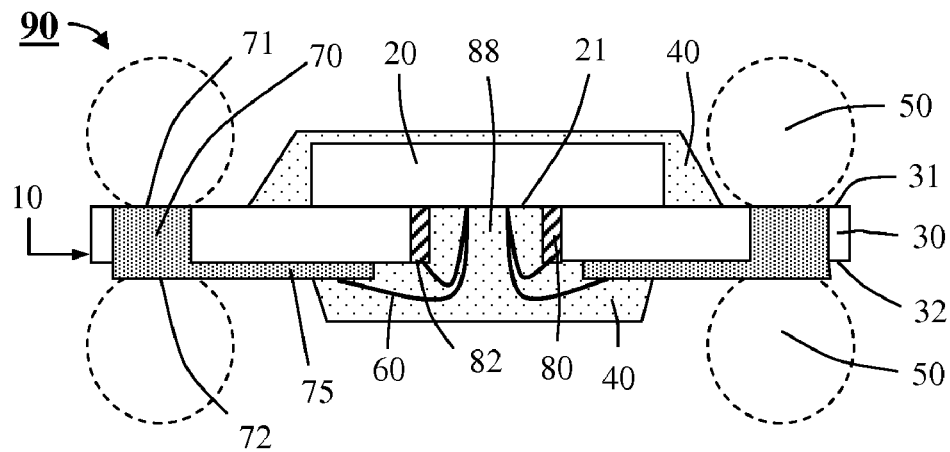

FIG. 7 shows an electrical device 90, wherein the extending portion 75 of first conductive element 70 coupled with the first lower surface 32 of insulator 30, the submember 80 having a through hole 88 serving as an opening of said substrate 10, in this manner, the substrate 10 having an opening (88); a chip 20, wherein the active surface 21 of said chip 20 is coupled with the first upper surface 31 of insulator 30,(i.e. the active surface 21 of said chip 20 is coupled with the surface of substrate 10), meanwhile a portion of active surface 21 of chip 20 exposed to the opening of the substrate 10; a plurality of conductive wires 60 pass through the opening of substrate 10 and electrically connect the chip 20 to either the first conductive elements 70 or the first lower surface 82 of submember 80 respectively; a plurality of encapsulant 40 encapsulate the chip 20, conductive wires 60 and the substrate 10; accordingly, due to both the first upper surface 71 and the first lower surface 72 of first conductive element 70 exposed to the insulator 30 respectively, in this manner, Not only the electrical device 90 enables to be electrically connected to outside by means of the solder ball 50 attached onto both the first upper surface 71 and the first lower surface 72 of first conductive element 70, but the electrical device 90 also enables to be electrically connected to another electrical device (not shown) and stacked thereon, in this manner, said electrical device 90 will become more useful.

Figure 8:
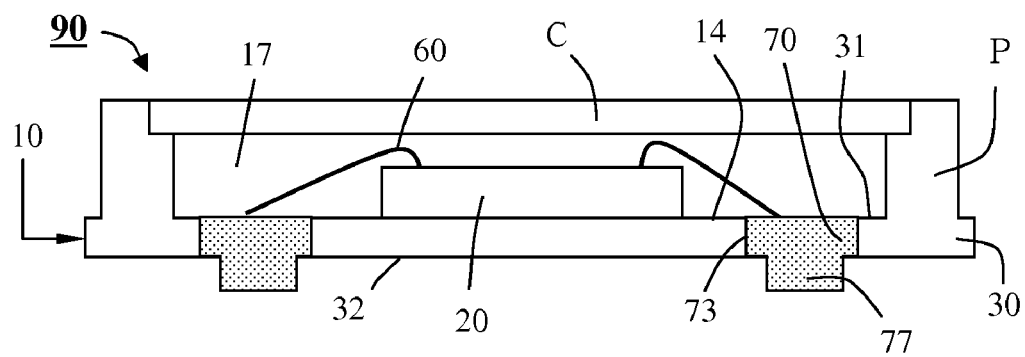

FIG. 8 shows an electrical device 90, wherein the insulator 30 having a protruding portion(s) "P" which is (are) protruding the first upper surface 31 of insulator 30, wherein said protruding portion "P" is close to the periphery of the insulator30; a chip 20 mounted on the receiving area 14; a plurality of conductive wires 60 electrically connect the chip 20 to the first conductive elements 70 respectively; a lid "C" situated on the protruding portion "P" of insulator 30, in this manner, a sealed area 17 is formed by both the lid "C" and the substrate 10, then the chip 20 and the conductive wires 60 are all hermetically sealed in the sealed area 17, wherein the chip 20 may be employed as an image sensor, optical chip or the like, and the lid "C" may be employed as a transparent plate as required; in addition, an encapsulant (not shown) may be filled into the sealed area 17 for encapsulating the chip 20, conductive wires 60 and the substrate 10, nevertheless the lid "C" may be employed as a heat spreader as required.

In accordance with the foregoing descriptions accompanying drawings, this invention has been described in terms of several preferred embodiments, various alternations and modifications can be made to become apparent to those skilled in the art; For examples: as shown in FIG. 1A, wherein said submember 80 may further include a through hole (refer to "88" in FIG. 7) as required;; as shown in FIG. 5, wherein a heat spreader (not shown) may be mounted on the inactive surface 22 of said chip 20; furthermore, the first conductive element of substrate in accordance with the present invention enable to be predetermined shape as required; Accordingly, since many such various alterations and/or modifications can be made to the foregoing descriptions, it is to be understood that the scope of the invention is not limited to the disclosed embodiments but is defined by the appended claims.

What is claimed is:

1. A substrate for electrical device, comprising:

at least a first conductive element having at least a first upper surface, a first lower surface, a first side edge and a protruding portion;

at least an insulator having at least a first upper surface, a first lower surface and a side wall, said first conductive element encapsulated by said insulator and embedded therein, in this manner, said first side edge of said first conductive element being encapsulated by said insulator, wherein said protruding portion of said first conductive element being protruded and exposed to the first lower surface of said insulator, in this manner, said first lower surface of said first conductive element being protruded and exposed to the first lower surface of said insulator too; and wherein said first upper surface of said first conductive element exposed to said first upper surface of said insulator for being plated by at least a conductive material, wherein said first upper surface of said first conductive element being below said first upper surface of said insulator, therefore, at least a recess formed by said first conductive element associated with said insulator, wherein the bottom of said recess formed by said first upper surface of said first conductive element, and wherein said recess being for accommodating at least a conductive material; and at least a conductive material, wherein said first upper surface of said conductive element being plated by said conductive material, and wherein at least a portion of said conductive material being placed within said recess, and wherein at least an another portion of said conductive material exposed to said first upper surface of said insulator.

2. The substrate of claim 1, further comprising at least an another conductive material, wherein said conductive material being plated by said another conductive material, and wherein at least a portion of said another conductive material exposed to said first upper surface of said insulator.

3. The substrate of claim 2, further comprising at least a further another conductive material; wherein said another conductive material being plated by said further another conductive material, and wherein at least a portion of said further another conductive material exposed to said first upper surface of said insulator.

4. The substrate of claim 1, wherein said insulator further comprising at least a through hole.

5. The substrate of claim 1, wherein said first conductive element further comprising at least an extending portion which is extended from said protruding portion of first conductive element, and wherein said extending portion is common unitary with said protruding portion of first conductive element and is coupled with said first lower surface of insulator.

* * * * *